United States Patent
Yang et al.

(10) Patent No.: US 6,723,609 B2
(45) Date of Patent: Apr. 20, 2004

(54) METHOD OF PREVENTING LEAKAGE CURRENT OF A METAL-OXIDE SEMICONDUCTOR TRANSISTOR

(75) Inventors: Ming-Sheng Yang, Hsin-Chu (TW); Chia-Hung Kao, Tai-Nan (TW); Chin-Cheng Chien, Chia-Yi Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/065,717

(22) Filed: Nov. 13, 2002

(65) Prior Publication Data

US 2003/0148585 A1 Aug. 7, 2003

Related U.S. Application Data

(63) Continuation-in-part of application No. 09/683,691, filed on Feb. 4, 2002, now abandoned.

(51) Int. Cl.[7] .................. H01L 21/336; H01L 21/3205; H01L 21/44
(52) U.S. Cl. ................... 438/303; 438/299; 438/301; 438/305; 438/592; 438/595; 438/655; 438/683; 438/230; 438/514
(58) Field of Search ................... 438/303, 299, 438/301, 304, 305, 592, 595, 596, 655, 683, 230, 514

(56) References Cited

U.S. PATENT DOCUMENTS

| | | | | |
|---|---|---|---|---|
| 5,153,145 A | * | 10/1992 | Lee et al. | 438/305 |
| 6,297,132 B1 | * | 10/2001 | Zhang et al. | 438/514 |
| 6,380,039 B2 | * | 4/2002 | Badenes et al. | 438/301 |
| 6,432,784 B1 | * | 8/2002 | Yu | 438/303 |
| 6,506,650 B1 | * | 1/2003 | Yu | 438/301 |

* cited by examiner

Primary Examiner—John F. Niebling
Assistant Examiner—Ron Pompey
(74) Attorney, Agent, or Firm—Winston Hsu (57) ABSTRACT

A gate oxide layer and a gate are sequentially formed on a substrate, and a source/drain extension is formed in the substrate thereafter. A liner layer is then formed to cover the substrate, and a first dielectric layer and a second dielectric layer are sequentially formed on the liner layer. By performing an etching process, a L-shaped spacer is formed on either side of the gate. Portions of the liner layer uncovered by the L-shaped spacer are then removed, and a step source/drain extension and a source/drain are simultaneously formed in the substrate thereafter. Finally, a salicide process is performed to form a silicide layer on the gate and on portions of the silicon substrate surface above the source/drain.

19 Claims, 8 Drawing Sheets

METHOD OF PREVENTING LEAKAGE CURRENT OF A METAL-OXIDE SEMICONDUCTOR TRANSISTOR

CROSS REFERENCE TO RELATED APPLICATIONS

This is a continuation-in-part of U.S. application Ser. No. 09/683,691, filed Feb. 4, 2002 now abandoned, and which is included herein by reference.

BACKGROUND OF INVENTION

1. Field of the Invention

The present invention relates to a method of forming a metal-oxide semiconductor (MOS) transistor on a substrate, and more specifically, to a method of forming a MOS transistor with a step source/drain extension to reduce leakage current caused by a self-aligned silicide (salicide) process.

2. Description of the Prior Art

Metal oxide semiconductor (MOS) transistors are in wide use in many electric devices. A MOS transistor has four terminals: the source, the drain, the gate, and the substrate. When a gate voltage greater than a threshold voltage of a MOS transistor is applied to the gate, a channel forms between the source and the drain due to strong inversion. Consequently, the electrical performance of the gate is an important issue in the semiconductor industry.

Figure 1:
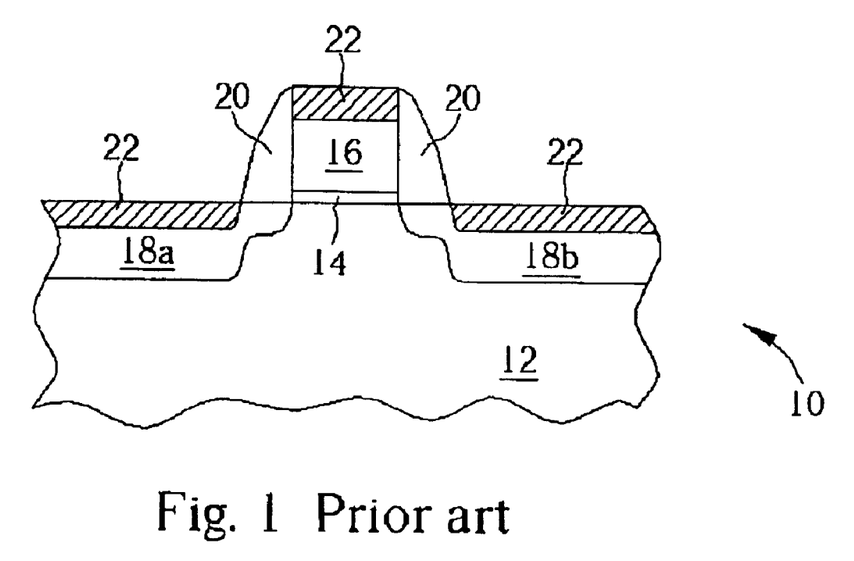
FIG. 1 is a schematic view of a MOS transistor according to the prior art.

Please refer to FIG. 1 of a schematic view of a MOS transistor according to the prior art. As shown in FIG. 1, a MOS transistor 10 comprises a substrate 12, a gate oxide layer 14 located on the substrate 12, a gate 16 located on the gate oxide layer 14, a lightly doped drain (LDD) 24 either in portions of the substrate 12 adjacent to either side of the gate 16, a pair of spacers 20 positioned on both sides of the gate 16, and a source/drain 18a/18b formed in portions of the substrate 12 adjacent to either side of the spacer 20. In addition, contact plugs (not shown), which are located upon the gate 16, the source 18a, and the drain 18b, electrically connect the MOS transistor 10 and any other metal conductors (not shown). In general, a suicide layer 22 is formed on the gate 16, the source 18a and the drain 18b in order to reduce the contact resistance of each silicon surface. Then, contact plugs are formed on the silicide layer 22.

The LDD 24 has a high resistivity and is thus replaced by an ultra shallow junction (USJ, not shown in FIG. 1) as the manufacturing line width is less than 0.18 microns. Due to an increase in the complexity of integrated circuits, sizes of MOS transistors are reduced to increase the amounts of MOS transistors per unit area. However, the shallower the junction depth of the ultra shallow junction, the smaller the distance between a bottom of the source 18a/drain 18b and a bottom of the silicide layer 22. As a result, shrinking the sizes of MOS transistors causes the diffusion of metal atoms in the silicide layer 22 into the substrate 12 and increases the leakage current of the MOS transistor 10. In addition, as the width of the gate 16 reduced due to the reduction of the size of the MOS transistor 10, the correspondingly decreased distance between the two ultra shallow junctions on opposite sides of the gate 16 frequently lead to a punch through phenomenon of the MOS transistor 10. The performance of the MOS transistor 10 is therefore reduced.

SUMMARY OF INVENTION

It is therefore a primary object of the present invention to provide a method of fabricating a metal-oxide semiconductor (MOS) transistor.

It is another object of the present invention to provide a method of preventing the leakage current in an ultra shallow junction of a source/drain extension of the MOS transistor.

According to the claimed invention, a gate oxide layer and a gate are sequentially formed on a silicon substrate. By performing a first ion implantation process, the source/drain extension is formed in the silicon substrate. A liner layer is then formed to cover the silicon substrate, and a dielectric layer and a sacrificial layer are sequentially formed on the liner layer thereafter. By performing a first etching process, an arc-shaped spacer is formed on either side of the gate, and portions of the dielectric layer and the sacrificial layer atop the gate are removed. A L-shaped spacer is then formed on either side of the gate by performing a second etching process to remove portions of the sacrificial layer within the arc-shaped spacer. By performing a third etching process, portions of the liner layer not covered by the L-shaped spacer are removed. By performing a second ion implantation process, a step source/drain extension and a source/drain are simultaneously formed in the silicon substrate, wherein the source/drain extension, the step source/drain extension and the source/drain are in a gradient profile. Finally, a self-aligned silicide (salicide) process is performed to form a silicide layer on the gate and on portions of the silicon substrate surface above the source/drain.

It is an advantage of the present invention against the prior art that a plurality of ion implantation processes is performed to form the source/drain extension, the step source/drain extension and the source/drain in the gradient profile, increasing the distance between a bottom of the source/drain and a bottom of the silicide layer. The leakage current in the ultra shallow junction of the source/drain extension of the MOS transistor is thus prevented. In addition, a punch through phenomenon of the MOS transistor as described in the prior art is prevented as well. Therefore, as sizes of MOS transistors are reduced to increase the amounts of MOS transistors per unit area due to an increase in the complexity of integrated circuits, the method of fabricating the MOS transistor provided in the present invention can assure the performance of the MOS transistor, making the product more competitive.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 2:
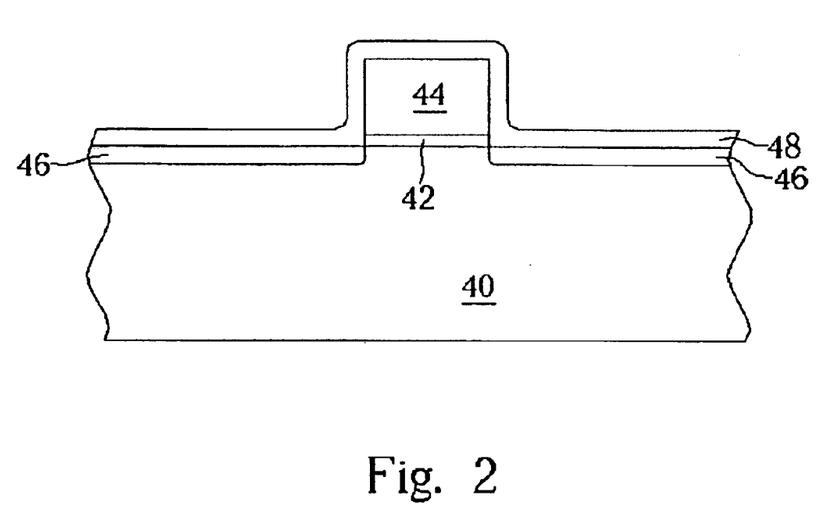
FIG. 2 to FIG. 8 are schematic views of fabricating a metal-oxide semiconductor (MOS) transistor according to the present invention.

Please refer to FIG. 2 to FIG. 8 of schematic views of fabricating a metal-oxide semiconductor (MOS) transistor according to the present invention. As shown in FIG. 2, a silicon substrate 40 is provided with a gate oxide layer 42 and a gate 44 sequentially formed on the silicon substrate 40. At the beginning of the method, a first ion implantation process is performed to form a source/drain extension (SDE) 46 in the silicon substrate 40, and a liner layer 48, comprising silicon oxide, is then formed to cover the silicon substrate 40. In the preferred embodiment of the present invention, the source/drain extension 46 is doped with either arsenic (As) atoms or phosphorus (P) atoms. Alternatively, the source/drain extension 46 is doped with either one of boron difluoride ($BF_2^+$) ions, boron (B) atoms or indium (In) atoms. In another embodiment of the present invention, the gate 44 further comprises an offset spacer (not shown in FIG. 2 to FIG. 8) on either side of the gate 44.

Figure 3:
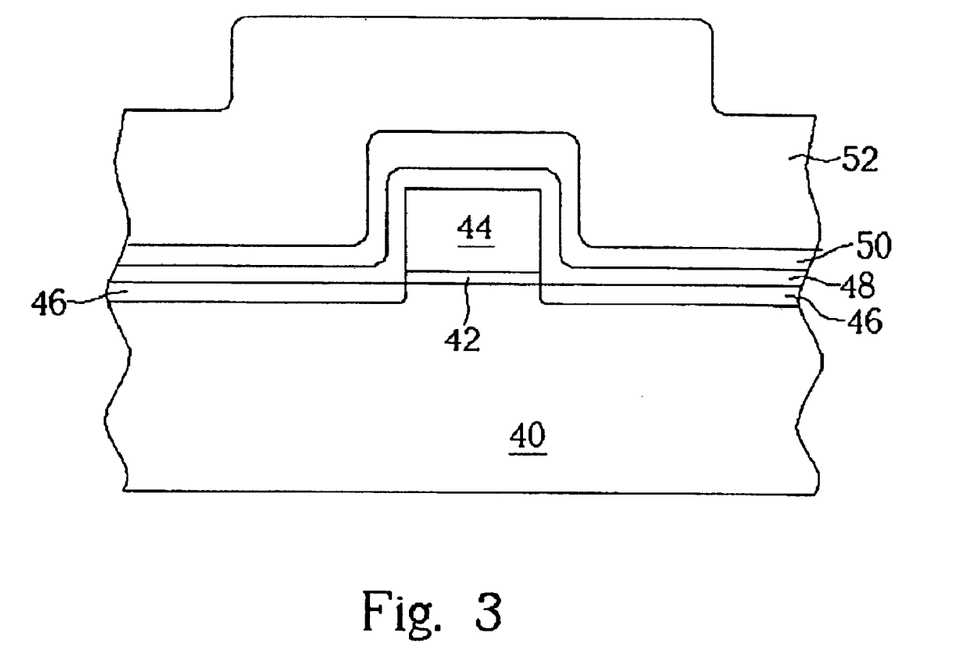
Figure 4:
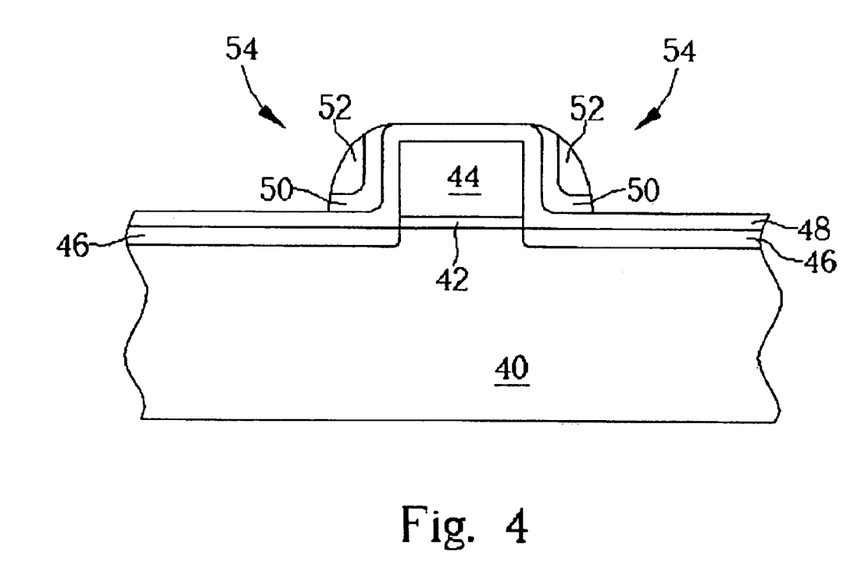

As shown in FIG. 3, a dielectric layer 50, comprising nitride, and a sacrificial layer 52, comprising polysilicon, are then sequentially formed on the liner layer 48. As shown in FIG. 4, by utilizing the liner layer 48 as a stop layer, a first etching process is performed to form an arc-shaped spacer 54 on either side of the gate 44 and to remove portions of the dielectric layer 50 and the sacrificial layer 52 atop the gate 44.

Figure 5:
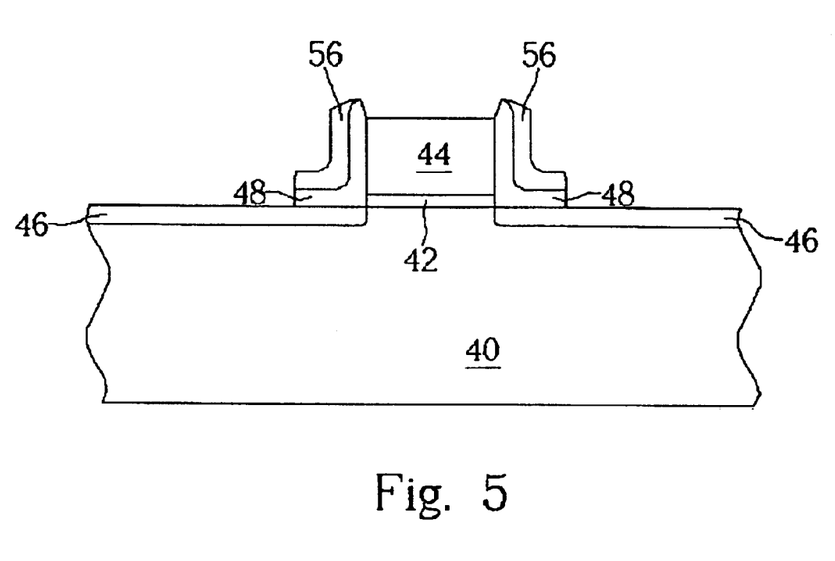

As shown in FIG. 5, by utilizing the dielectric layer as a stop layer, a second etching process is performed to remove portions of the sacrificial layer 52 within the arc-shaped spacer 54, forming a L-shaped spacer 56 on either side of the gate 44. A third etching process is then performed to remove portions of the liner layer 48 not covered by the L-shaped spacer 56, exposing a top surface of the gate 44 and portions of the source/drain extension 46.

Figure 6:
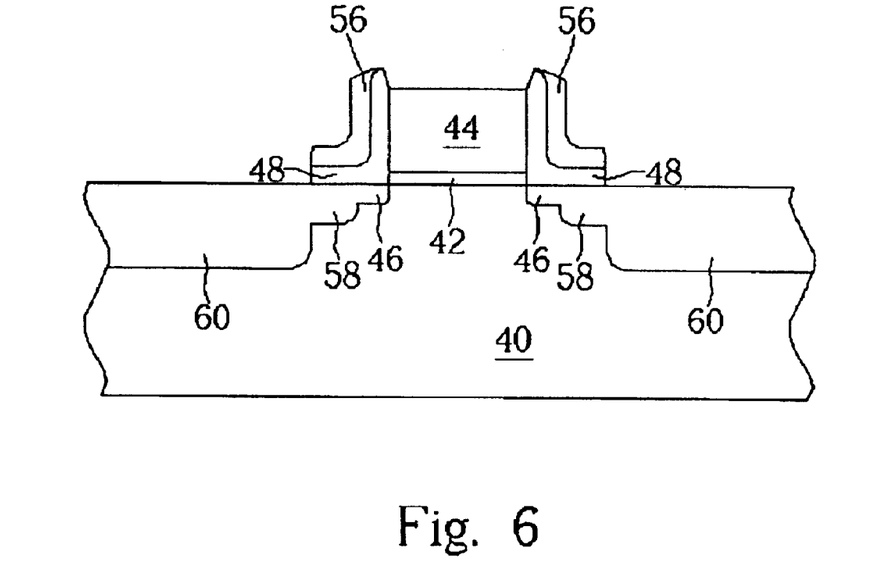

As shown in FIG. 6, using either arsenic atoms or phosphorus atoms as dopants, a second ion implantation process is then performed to simultaneously form a step source/drain extension 58 and a source/drain 60 in the silicon substrate 40. In another embodiment of the present invention, the step source/drain extension 58 and the source/drain 60 are doped with either one of boron difluoride ions, boron atoms or indium atoms. Wherein the depth and the width of the step source/drain extension 58 are respectively determined by the thickness of the dielectric layer 50 and the width of the L-shaped spacer 56, and the source/drain extension 48, the step source/drain extension 58 and the source/drain 60 are in a gradient profile.

Figure 7:
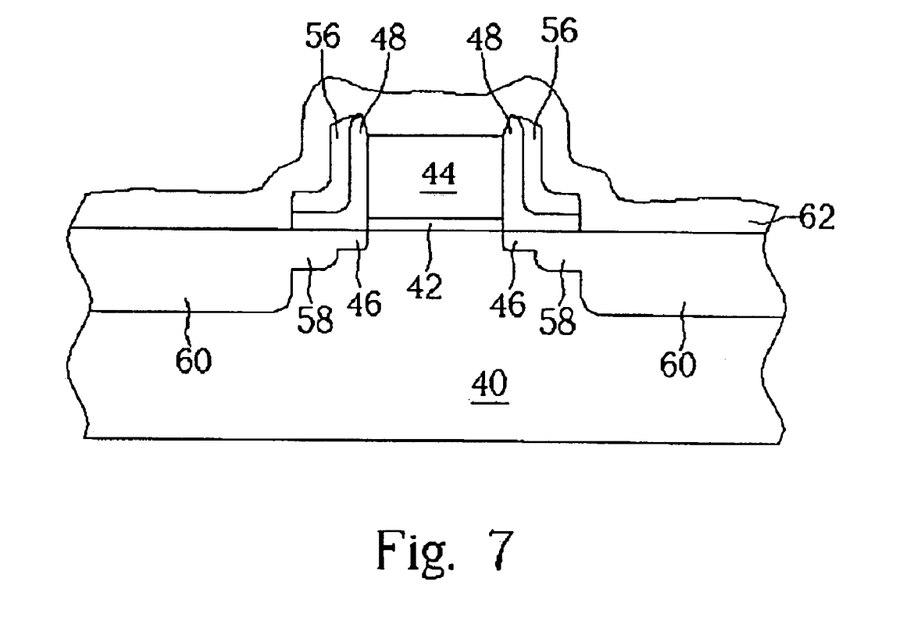
Figure 8:
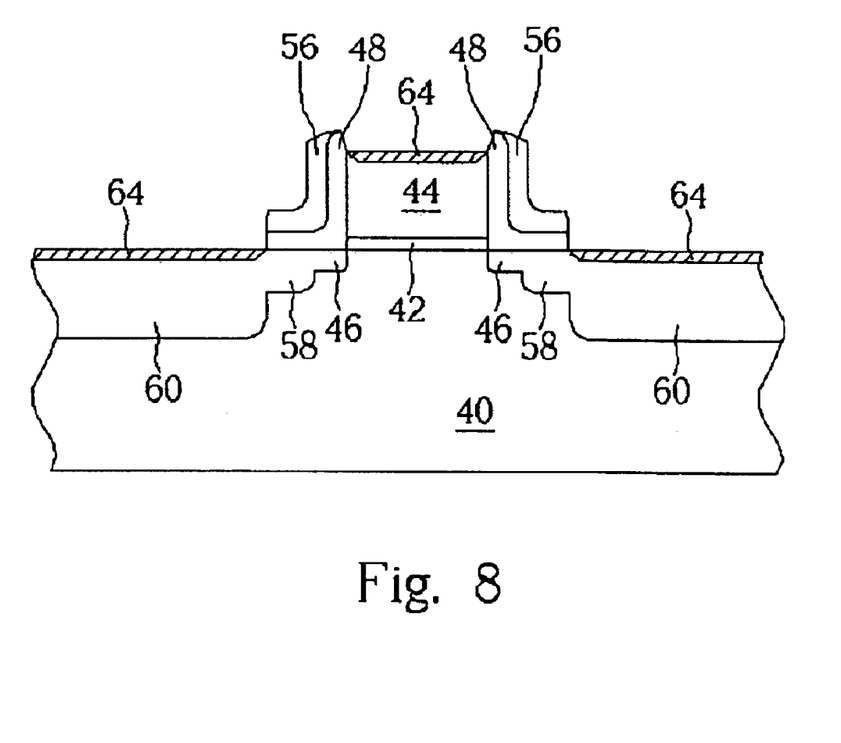

As shown in FIG. 7, a metal layer 62 is then formed to cover the silicon substrate 40. In the preferred embodiment of the present invention, the metal layer 62 is composed of cobalt (Co). As shown in FIG. 8, a first rapid thermal process (RTP) is then performed, activating the reaction of the metal layer 62 with the silicon substrate 40. A wet etching process is then performed to remove unreacted portions of the metal layer 62 on the surface of the silicon substrate 40. Finally, a second RTP is performed to form a silicide layer 64 on the gate 44 and on portions of the surface of the silicon substrate 40 above the source/drain 60. The method of forming the silicide layer 64 comprising the steps described in this paragraph is called a self-aligned silicide (salicide) process.

As previously mentioned, due to an increase in the complexity of integrated circuits, sizes of MOS transistors are reduced to increase the amounts of MOS transistors per unit area. Therefore, the depth of the source/drain extension 46 decreases and an ultra shallow junction of the source/drain extension 46 is thus formed. In comparison with the prior art, the method of fabricating a MOS transistor provided in the present invention utilized a plurality of ion implantation processes to form the source/drain extension 46, the step source/drain extension 58 and the source/drain 60 in the gradient profile, increasing the distance between a bottom of the source/drain 60 and a bottom of the silicide layer 64. The leakage current in the ultra shallow junction of the source/drain extension 46 of the MOS transistor is thus prevented. In addition, a punch through phenomenon of the MOS transistor as described in the prior art is prevented as well. Therefore, as sizes of MOS transistors are reduced to increase the amounts of MOS transistors per unit area due to an increase in the complexity of integrated circuits, the method of fabricating the MOS transistor provided in the present invention can assure the performance of the MOS transistor, making the product more competitive.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of fabricating a metal-oxide semiconductor transistor (MOS transistor) on a substrate comprising:

sequentially forming a gate oxide layer and a gate on the substrate;

performing a first ion implantation process to form a first doped region in the substrate;

sequentially forming a liner layer, a dielectric layer and a sacrificial layer on the substrate;

performing a first etching process to simultaneously form an arc-shaped spacer on either side of the gate and remove portions of the dielectric layer and the sacrificial layer atop the gate by utilizing the liner layer as a first stop layer;

performing a second etching process to remove portions of the sacrificial layer within the arc-shaped spacer by utilizes the dielectric layer as a second stop layer, and constructing a L-shaped spacer on either side of the gate;

performing a third etching process to remove portions of the liner layer not covered by the L-shaped spacer;

performing a second ion implantation process to form a second doped region with a gradient profile in portions of the substrate adjacent to either side of the L-shaped spacer; and performing a self-aligned silicide (salicide) process to form a silicide layer on the gate and on exposed portions of the substrate surface above the second doped region.

2. The method of claim 1 wherein the substrate is a silicon substrate.

3. The method of claim 1 wherein the gate comprises an offset spacer on either side of the gate.

4. The method of claim 1 wherein the liner layer, the dielectric layer and the sacrificial layer respectively comprise silicon oxide, nitride and polysilicon.

5. The method of claim 1 wherein the first and second doped regions are in a gradient profile, the first doped region is employed as a source/drain extension, and the second doped region comprises a step source/drain extension and a source/drain of the MOS transistor employed to prevent leakage current of the silicide layer.

6. The method of claim 5 wherein the depth and the width of the step source/drain extension are respectively determined by the thickness of the dielectric layer and the width of the L-shaped spacer.

7. The method of claim 5 wherein th silicide layer is formed by the steps of:

forming a metal layer on the gate and on portions of the substrate surface above the source/drain;

performing a first rapid thermal process (RTP);

performing a wet etching process to remove unreacted portions of th metal layer on th surface of the substrate; and performing a second RTP.

8. The method of claim 7 wherein the metal layer comprises cobalt (Co).

9. The method of claim 1 wherein the first and second doped regions are doped with either arsenic (As) atoms or phosphorus (P) atoms.

10. The method of claim 1 wherein the first and second doped region are doped with either one of boron difluoride ($BF_2^+$) ions, boron (B) atoms or indium (In) atoms.

11. A method of fabricating a MOS transistor on a substrate comprising:

sequentially forming a gate oxide layer and a gat on the substrate;

performing a first ion implantation process to form a first doped region in the substrate;

forming a liner layer to cover the substrate;

sequentially forming a dielectric layer and a sacrificial layer on the lin r layer;

performing a first etching process to simultaneously form an arc-shaped spacer on either side of the gate and remove portions of the dielectric layer and the sacrificial layer atop the gate by utilizing the liner layer as a first stop layer;

performing a second etching process to remove portions of the sacrificial layer within the arc-shaped spacer by utilizes the dielectric layer as a second stop layer, and constructing a L-shaped spacer on either side of the gate;

performing a third etching process to remov portions of the liner layer not covered by the L-shaped spacer;

performing a second ion implantation process to simultaneously form a second doped region and a third doped region in the substrate; and performing a salicide process to form a silicide layer on the gate and on portions of the substrat surface above the third doped region.

12. The method of claim 11 wherein the substrate is a silicon substrate.

13. The method of claim 11 wherein the first, second and third doped regions are in a gradient profile and are respectively employed as a source/drain extension, a step source/drain extension and a source/drain of the MOS transistor, and th second doped region is employed to prevent leakag current of the silicide layer.

14. The method of claim 11 wherein the liner layer, the dielectric layer and the sacrificial layer respectively comprise silicon oxide, nitride and polysilicon.

15. The method of claim 11 wherein the first, second and third doped regions are doped with either arsenic atoms or phosphorus atoms.

16. The method of claim 11 wherein the first, second and third doped regions are doped with either one of boron difluoride ions, boron atoms or indium atoms.

17. The method of claim 11 wherein the depth and the width of the second doped region are respectively determined by the thickness of the dielectric layer and the width of the L-shaped spacer.

18. The method of claim 11 wherein the silicide layer is formed by the steps of:

forming a metal layer on the gate and on portions of the substrate surface above the third doped region;

performing a first RTP;

performing a wet etching process to remove unreacted portions of the metal layer on the surface of the substrate; and performing a second RTP.

19. The method of claim 18 wherein the metal layer comprises cobalt.

* * * * *